(12) United States Patent
Minamoto

(10) Patent No.: US 8,659,968 B2
(45) Date of Patent: Feb. 25, 2014

(54) POWER SUPPLY CIRCUIT AND SEMICONDUCTOR MEMORY DEVICE INCLUDING THE POWER SUPPLY CIRCUIT

(75) Inventor: Takatoshi Minamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 93 days.

(21) Appl. No.: 13/178,823

(22) Filed: Jul. 8, 2011

(65) Prior Publication Data

US 2012/0182813 A1    Jul. 19, 2012

(30) Foreign Application Priority Data

Jan. 17, 2011 (JP) ................. 2011-007201

(51) Int. Cl.
*G11C 5/14* (2006.01)
(52) U.S. Cl.
USPC .......... 365/226; 365/189.07; 365/225.7
(58) Field of Classification Search
USPC ......... 365/189.11, 185.18, 185.17, 185.33, 365/226, 185.09, 200, 225.7, 189.07
See application file for complete search history.

(56) References Cited

U.S. PATENT DOCUMENTS

| 7,916,547 | B2 | 3/2011 | Hosono | |
| 8,040,731 | B2 * | 10/2011 | Hashimoto | ............. 365/185.18 |
| 2009/0115497 | A1 | 5/2009 | Takeyama | |

FOREIGN PATENT DOCUMENTS

| JP | 10-106283 | A | | 4/1998 |
| JP | 11-154396 | A | | 6/1999 |
| JP | 2008-217577 | | | 9/2008 |
| JP | 2008-289252 | | | 11/2008 |
| JP | 2009-146510 | A | | 7/2009 |
| JP | 2010-40076 | | | 2/2010 |
| JP | 2010-86628 | A | | 4/2010 |
| JP | 2010157277 | A | * | 7/2010 |

OTHER PUBLICATIONS

Office Action issued Jul. 2, 2013, in Japanese Patent Application No. 2011-007201 with English translation.

* cited by examiner

*Primary Examiner* — Alexander Sofocleous
*Assistant Examiner* — Hien Nguyen
(74) *Attorney, Agent, or Firm* — Oblon, Spivak, McClelland, Maier & Neustadt, L.L.P.

(57) ABSTRACT

According to one embodiment, a power supply circuit, which generates a power supply voltage which is applied to a memory cell array including a plurality of memory cells disposed at intersections between a plurality of word lines and a plurality of bit lines, comprises a first boost circuit configured to boost an input voltage, a first voltage step-down circuit having an input connected to an output of the first boost circuit, and a voltage control circuit configured to control the first boost circuit and the first voltage step-down circuit. The voltage control circuit is configured to generate, not via the first voltage step-down circuit, a voltage which is boosted by the first boost circuit, when a first voltage is transferred to a non-selected memory cell.

15 Claims, 10 Drawing Sheets

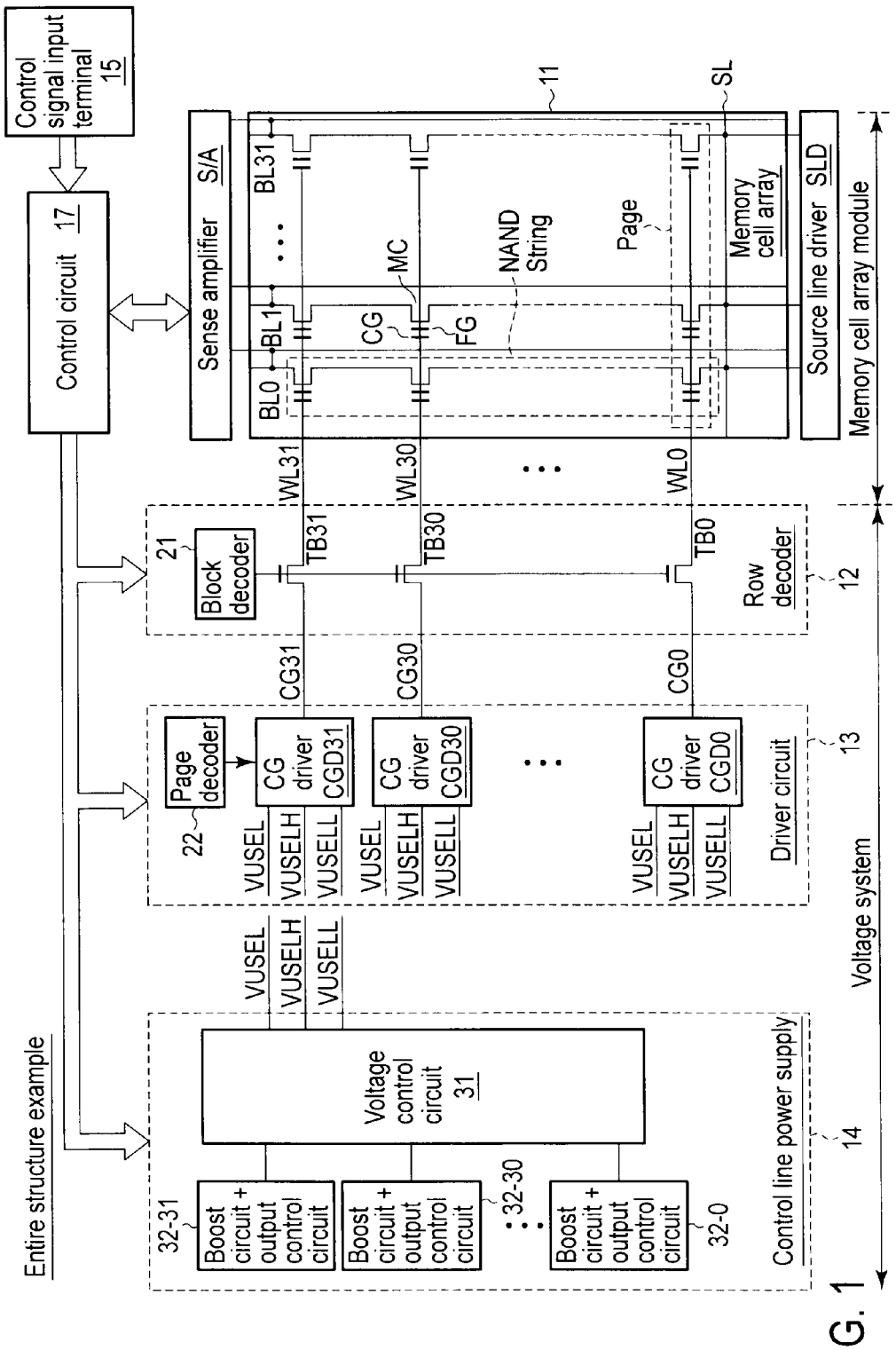
F I G. 1

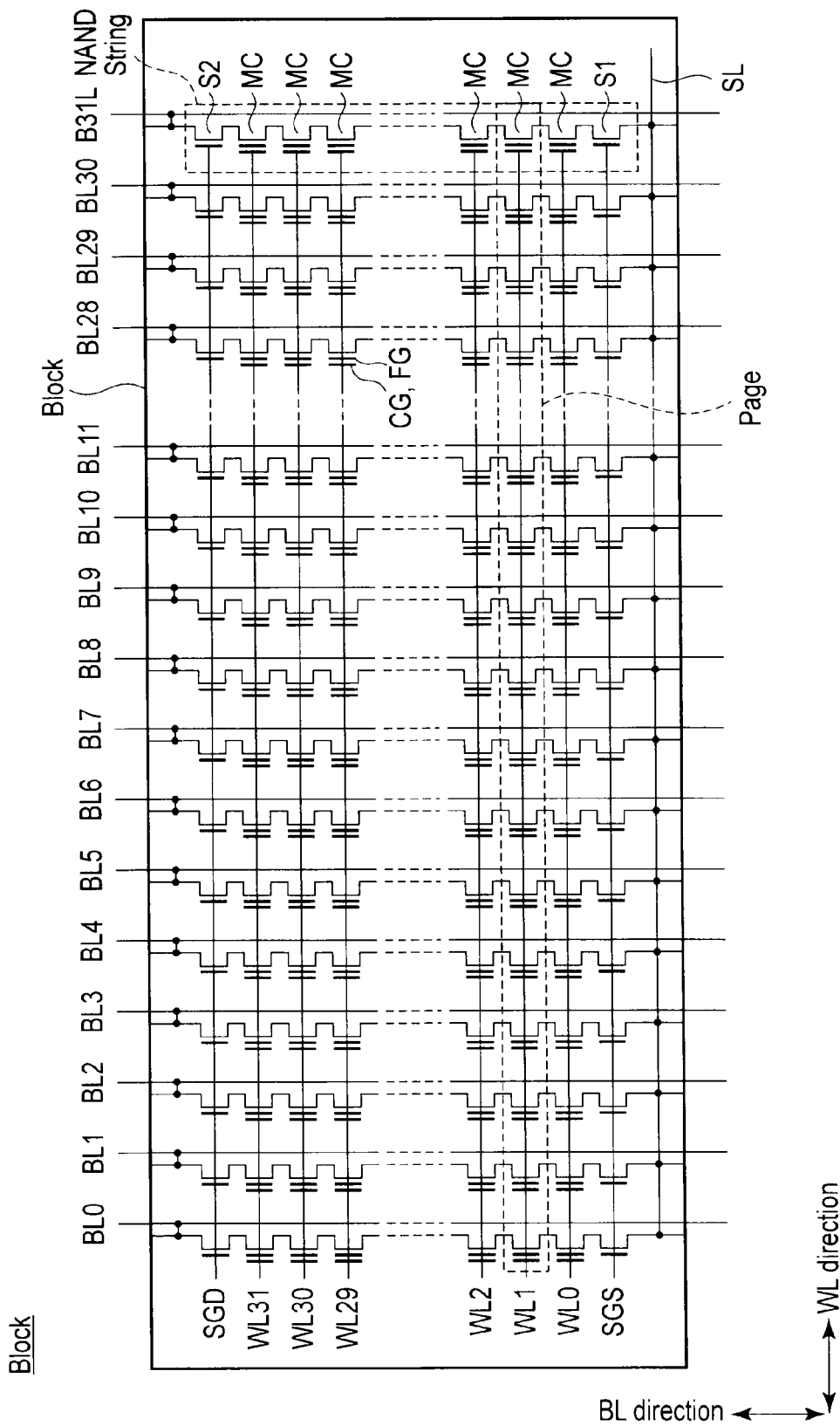
F I G. 2

Structure example of voltage step-down circuit 35-1

Relationship between set voltage and boost capability of boost circuit

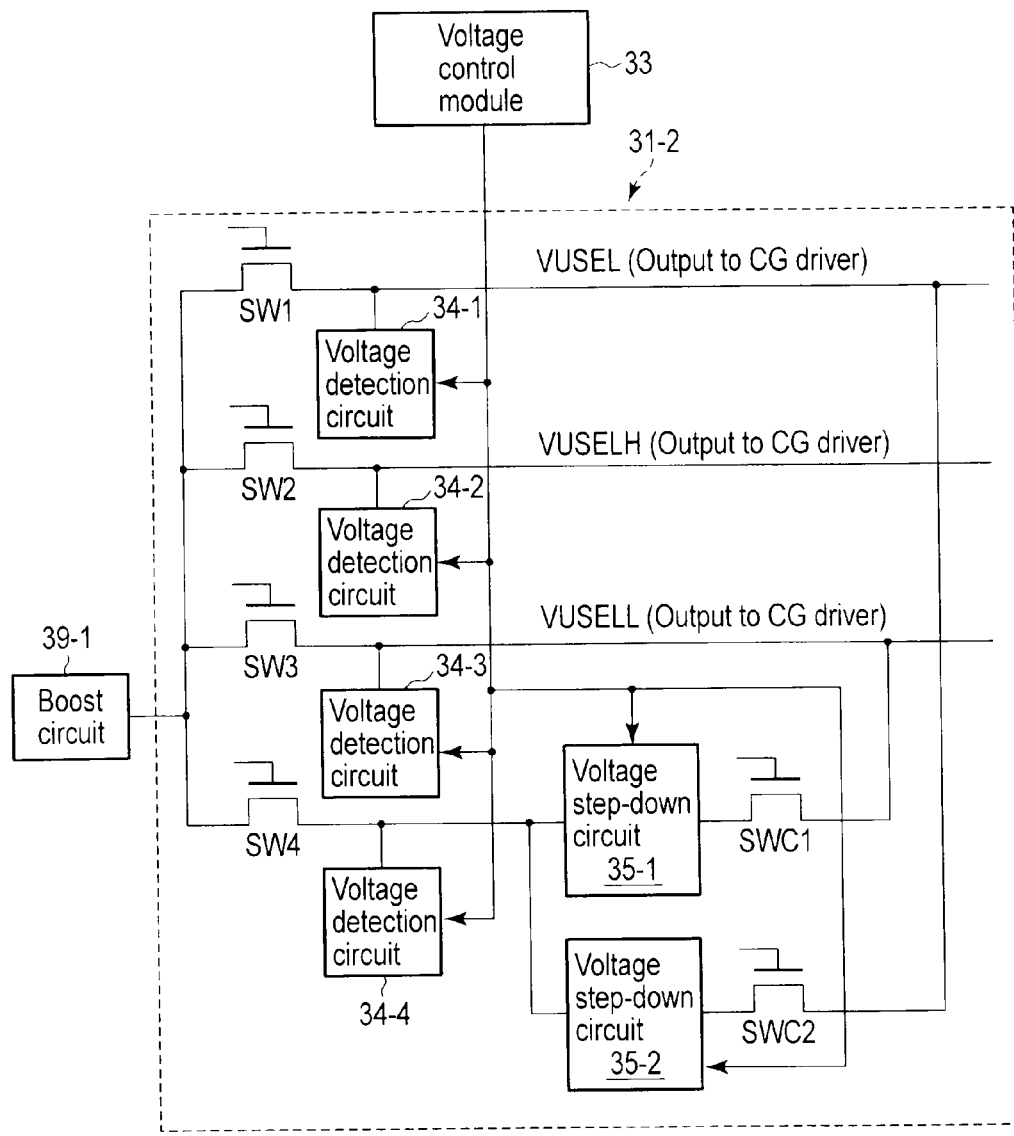
F I G. 8

POWER SUPPLY CIRCUIT AND SEMICONDUCTOR MEMORY DEVICE INCLUDING THE POWER SUPPLY CIRCUIT

CROSS-REFERENCE TO RELATED APPLICATIONS

This application is based upon and claims the benefit of priority from Japanese Patent Application No. 2011-007201, filed Jan. 17, 2011; the entire contents of which are incorporated herein by reference.

FIELD

Embodiments described herein relate generally to a power supply circuit and a semiconductor memory device including the power supply circuit.

BACKGROUND

For example, in a semiconductor memory device such as a NAND flash memory, a voltage higher than a power supply voltage is used for a data write operation, a data erase operation and a data read operation. Thus, a power supply circuit for generating a voltage higher than the power supply voltage is disposed.

In the meantime, in a boost operation by the power supply circuit, the output voltage is not always a fixed voltage, and oscillates in the neighborhood of a set voltage. This phenomenon is called "ripple".

In the operation of the memory cell of the NAND flash memory, the ripple of the word line varies the voltage of the word line, causing such an influence as to spread the distribution of a threshold voltage Vth.

BRIEF DESCRIPTION OF THE DRAWINGS

FIG. 1 is a block diagram showing an example of the entire structure of a semiconductor device to which a power supply circuit according to a first embodiment is applied;

FIG. 2 is an equivalent circuit diagram showing a block (Block) in a memory cell array in FIG. 1;

FIG. 8 is an equivalent circuit diagram showing a structure example of a power supply circuit according a second embodiment;

DETAILED DESCRIPTION

Figure 3:
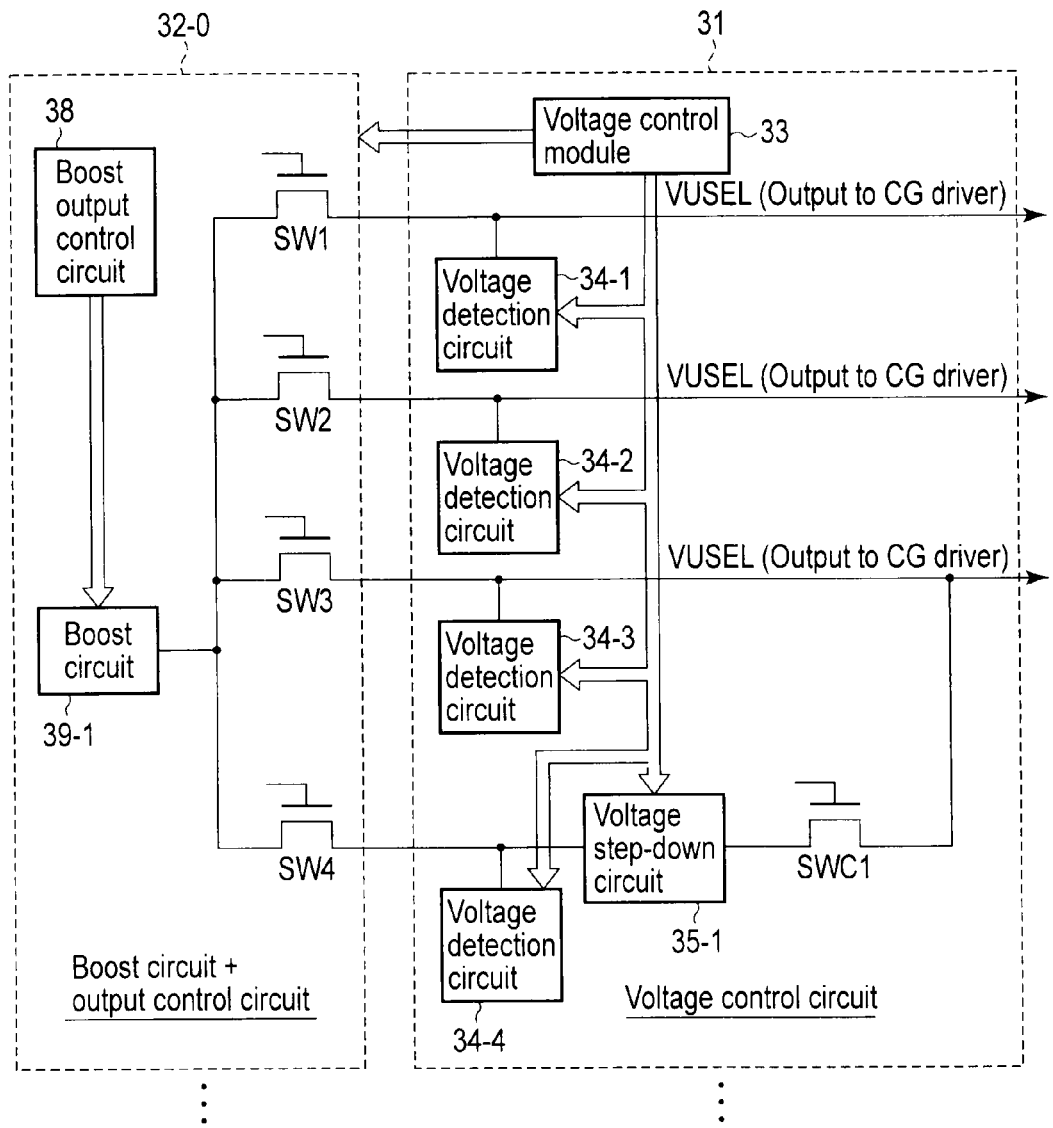
FIG. 3 is an equivalent circuit diagram showing a structure example of the power supply circuit according to the first embodiment.

In general, according to one embodiment, a power supply circuit, which generates a power supply voltage which is applied to a memory cell array including a plurality of memory cells disposed at intersections between a plurality of word lines and a plurality of bit lines, comprises a first boost circuit configured to boost an input voltage; a first voltage step-down circuit having an input connected to an output of the first boost circuit; and a voltage control circuit configured to control the first boost circuit and the first voltage step-down circuit. The voltage control circuit is configured to generate, not via the first voltage step-down circuit, a voltage which is boosted by the first boost circuit, when a first voltage is transferred to a non-selected memory cell, and the voltage control circuit is configured to execute such switching control as to step down, via the first voltage step-down circuit, the voltage which is boosted by the first boost circuit, when a second voltage which is lower than the first voltage is transferred to a selected memory cell.

Comparative Example

To begin with, a comparative example is described for the purpose of comparison with the embodiment which will be described later.

As an example for decreasing the above-described ripple, there is an example in which a filter circuit including, e.g. a resistance and a capacitance is provided at an output of a boost circuit. In this example, when an output of the boost circuit is applied to a load via the filter circuit, the ripple is decreased by this filter circuit.

To be more specific, there has been proposed a method of controlling a filter resistance in relation to an output voltage and a load variation (e.g. Jpn. Pat. Appln. KOKAI Publication No. 2008-289252). However, in this method, too, the capability of the boost circuit varies depending on set voltages, and it is difficult to control ripples at all set voltages. Further, the parasitic capacitance between lines further increases more shrinking, so the influence of non-selected lines upon a selected line increases. Thus, it is more important to control a ripple.

In addition, for example, owing to memory cell array shrinking of a NAND flash memory, the influence of interference between cells increases. As a result, a variation of threshold voltage of data stored in the memory cells increases. As an example in which the variation of threshold voltage is considered, there is a case in which when data is read, for example, the voltage of a control gate line of a non-selected memory cell, which neighbors a control gate line of a selected memory cell, is varied from the voltage of control gate lines of other non-selected memory cells.

Taking the above into account, the embodiment is described below with reference to the accompanying drawings. In the description below, a NAND flash memory is taken as an example of the semiconductor device to which the power supply circuit is applied. However, the embodiment is not limited to this example. In the description, common parts are denoted by like reference numerals throughout the drawings.

First Embodiment

Next, referring to FIG. 1 to FIG. 7, a description is given of a power supply circuit according to a first embodiment and a control operation thereof.

1. Structure Example

1-1. Entire Structure Example

To begin with, an entire structure example of a semiconductor device, to which the power supply circuit according to the first embodiment is applied, is described with reference to FIG. 1.

As shown in FIG. 1, a NAND flash memory according this example comprises a memory cell array module, a voltage system, a control signal input terminal 15 and a control circuit 17.

The memory cell array module comprises a memory cell array 11, a sense amplifier S/A, and a source line driver SLD.

The memory cell array 11 comprises a plurality of memory cells MC, which are disposed in a matrix at intersections between word lines (WL0 to WL31) and bit lines (BL0 to BL31). In each of the memory cells MC, a floating electrode FG and a control electrode CG are successively stacked on a semiconductor substrate, and the control electrode CG is connected to the word line (WL0 to WL31). The memory cell MC stores two-value data or multi-value data in accordance with the variation of the threshold of a transistor which is determined by the amount of charge that is injected in the floating electrode FG. In the meantime, the memory cell MC may have a MONOS (Metal-Oxide-Nitride-Oxide-Silicon) structure which traps electrons in a nitride film.

The current paths of the memory cells MC are connected in series, thereby constituting a NAND string (NAND String). In addition, plural memory cells MC in a word line direction constitute a page (Page). The details will be described later.

The sense amplifier S/A senses the states of the memory cells MC in a selected page via the bit lines (BL0 to BL31), and executes a data read operation which will be described later or executes a check (hereinafter referred to as "verity") of the states of the memory cells.

The source line driver SLD applies a predetermined voltage to the source line SL.

The voltage system comprises a row decoder 12, a driver circuit 13 and a control line power supply 14.

The row decoder 12 comprises a block decoder 21 and transfer transistors (TB0 to TB31). The block decoder 21 decodes an input block address. The transfer transistor (TB0 to TB31) has a current path with one end connected to the driver circuit 13 and the other end connected to the word line (WL0 to WL31). The transfer transistor (TB0 to TB31) transfers an output of the driver circuit 13 to the word line in accordance with an output of the block decoder 21 which is applied to a gate of the transfer transistor (TB0 to TB31).

The driver circuit 13 comprises a page decoder 22 and CG drivers (CGD0 to CGD31). The page decoder 22 decodes an input page address. In accordance with an output of the page decoder 22, the CG driver (CGD0 to CGD31) outputs, via the row decoder 12, a control signal (VUSEL, VUSELH, VUSELL), which is input from the power supply 14, as an output signal (CG0 to CG31) corresponding to the word line.

The control line power supply (power supply circuit) 14 comprises a voltage control circuit 31, a boost circuit & output control circuit (32-0 to 32-31). The voltage control circuit 31 controls the boost circuit & output control circuit (32-0 to 32-31) and outputs a control signal (VUSEL, VUSELH, VUSELL) to the driver circuit 13. The boost circuit & output control circuit (32-0 to 32-31) is under the control of the voltage control circuit 31, and generates a voltage higher than a power supply voltage, for example, at a time of a data write operation. The details will be described later.

A control signal, such as an address latch enable signal (ALE), is input from an external device (e.g. memory controller) to the control signal input terminal 15.

The control circuit 17 controls the operation of the NAND flash memory in accordance with a control signal which is input by the control signal input terminal 15.

Although not shown in FIG. 1, other necessary structural components are disposed.

1-2. Re: Memory Cell Array

Next, referring to FIG. 2, a description is given of a structure example of a block (Block) which constitutes the memory cell array 11 in FIG. 1. In the case of this example, since batch erase is executed in memory cell transistors in the block (Block), the block is a data erase unit.

As shown in FIG. 2, the block (Block) comprises a plurality of NAND strings (NAND String) which are arranged in a WL direction. The NAND string comprises 32 memory cells having current paths connected in series, a select transistor S1 connected to one end of the NAND string, and a select transistor S2 connected to the other end of the NAND string. In this example, the NAND sting comprises 32 memory cell transistors MT, but the NAND string may comprise two or more memory cell transistors, such as 8, 16 or 64 memory cell transistors.

One end of a current path of the select transistor S1 is connected to the source line SL, and one end of a current path of the select transistor S2 is connected to the bit line BL.

The word lines WL0 to WL31 extend in the WL direction, and are commonly connected to the control electrodes CG of the plural memory cells MC in the WL direction. A select gate line SGS extends in the WL direction and is commonly connected to the gates of plural select transistors S1 which are arranged in the WL direction. In addition, a select gate line SGD extends in the WL direction and is commonly connected to the gates of plural select transistors S2 which are arranged in the WL direction.

1-3. Structure Example of Power Supply Circuit

Next, referring to FIG. 3, a structure example of the power supply circuit (control line power supply) in FIG. 1 is described. In the description below, the voltage control circuit 31 and the boost circuit & output control circuit 32-0 are taken as an example.

As shown in FIG. 3, the voltage control circuit 31 according to this example comprises a voltage control module 33, voltage detection circuits 34-1 to 34-4, a voltage step-down circuit 35-1 and a switching element SWC1.

The voltage control module 33 controls the circuits in FIG. 3, for example, the voltage detection circuits 34, and controls the switching operation of the switching element in the circuit, such as the switching element SWC1.

The voltage detection circuits 34-1 to 34-4 detect the output voltage of the boost circuit & output control circuit 32-0, and maintain a desired set voltage. In the meantime, the number of voltage detection circuits 34-1 to 34-4 is not limited to four.

The voltage step-down circuit (first voltage step-down circuit) 35-1 is disposed between the output control circuit 32-0 and the switching element SWC1. As will be described later, the voltage step-down circuit (first voltage step-down circuit) 35-1 steps down the output voltage of the boost circuit 39-1, which is input at the time of, e.g. a data read operation. The voltage step-down circuit (first voltage step-down circuit) 35-1 delivers the stepped-down output voltage to one end of the current path of the switching element SWC1.

The other end of the switching element SWC1 is connected to the drain of the transfer transistor TB via the CG driver (CGD0 to CGD31). In accordance with a control signal of the voltage control module 33, which is applied to the gate electrode of the switching element SWC1, the switching element SWC1 outputs the output voltage (e.g. VUSELL) of the voltage step-down circuit 35-1, which has been input, to the CG driver.

The boost circuit & output control circuit 32-0 according to this example comprises switching elements SW1 to SW4, a boost output control circuit 38, and a boost circuit 39-1. The number of switching elements SW1 to SW4 is not limited to four.

The switching elements SW1 to SW4 have current paths which are commonly connected at one end to the output of the boost circuit 39-1, and are connected at the other end to the voltage detection circuits 34-1 to 34-4, respectively. The switching elements SW1 to SW4 deliver output voltages to the associated voltage detection circuits 34-1 to 34-4 of the voltage control circuit 31, in accordance with control signals which are delivered to the gate electrodes of the switching elements SW1 to SW4.

The boost output control circuit 38 controls the output voltage of the boost circuit 39-1. For example, by determining a set voltage shown in FIG. 5, the boost output control circuit 38 controls the output voltage of the boost circuit 39-1.

According to the control of the boost output control circuit 38, the boost circuit (first boost circuit) 39-1 boosts, for example, a power supply voltage which is input, and generates a high voltage which is higher than, e.g. the input power supply voltage. Although depiction is omitted, the boost circuit 39-1 is configured, for example, such that a MOS transistor and a capacitance are connected in series, and the boost circuit 39-1 is controlled by mutually complementary control signals (CLK signal, CLKB signal) which are input from the boost output control circuit 38 to one end of the capacitance, thereby boosting the power supply voltage.

1-4. Structure Example of the Voltage Step-Down Circuit

Figure 4:
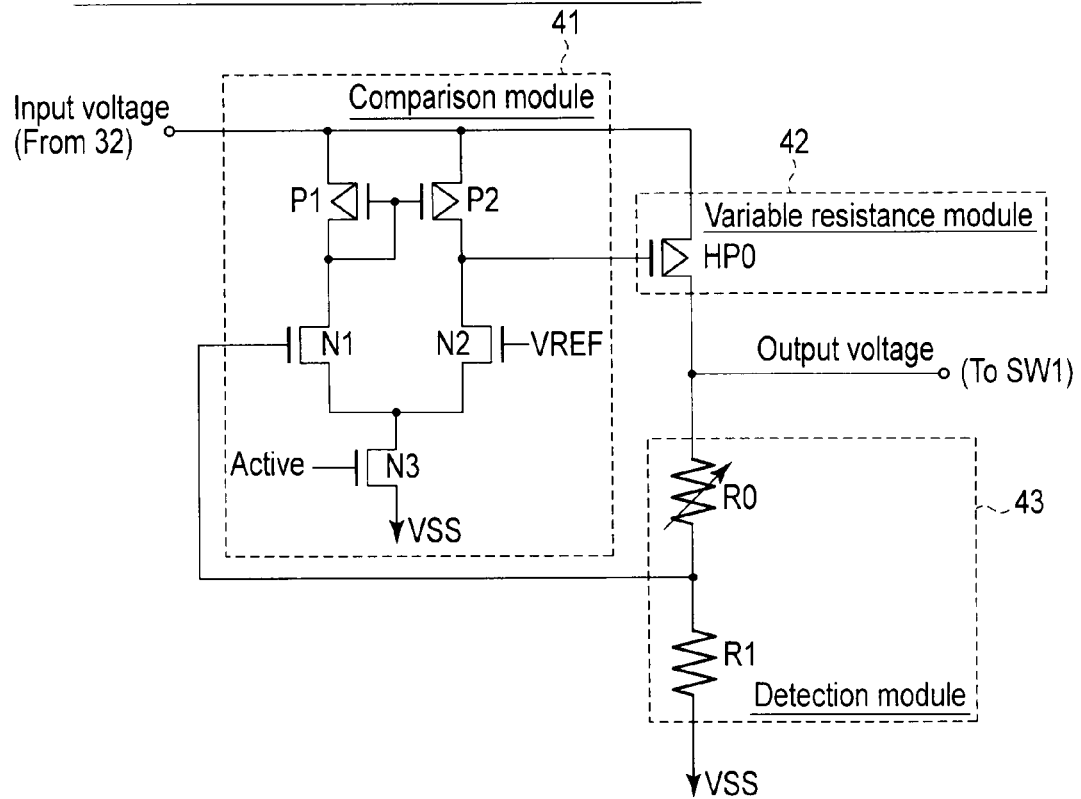
FIG. 4 is an equivalent circuit diagram showing a structure example of a voltage step-down circuit in FIG. 3.

Next, referring to FIG. 4, a structure example of the voltage step-down circuit 35-1 in FIG. 3 is described.

As shown in FIG. 4, the voltage step-down circuit 35-1 according to this example comprises a comparison module 41, a variable resistance module 42 and a detection module 43.

The comparison module 41 operates upon receiving a select signal (Active) from the voltage control module 33. The comparison module 41 compares a reference voltage VREF and a division voltage of the detection module 43, and outputs a voltage corresponding to the difference to a control terminal (gate electrode) of the variable resistance module 42.

The comparison module 41 comprises transistors P1, P2, N1, N2 and N3. The n-type transistors N1 and N2 and p-type transistors P1 and P2 constitute a current mirror circuit. An input voltage is applied to one end of the current path of each of the p-type transistors P1 and P2. The gate electrodes of the p-type transistors P1 and P2 and the other end of the current path of the p-type transistor P1 are connected to one end of the n-type transistor N1. The other end of the current path of the p-type transistor P2 is connected to the control terminal of the variable resistance module 42 and the n-type transistor N2. A division voltage of the detection module 43 is applied to the gate electrode of the n-type transistor N1, and the other end of the current path of the n-type transistor N1 is connected to one end of the current path of the n-type transistor N3. The reference voltage VREF is applied to the gate electrode of the n-type transistor N2, one end of the current path of the n-type transistor N2 is connected to the control terminal of the variable resistance module 42, and the other end of the current path of the n-type transistor N2 is connected to the one end of the current path of the n-type transistor N3. The select signal (Active) is delivered to the gate electrode of the n-type transistor N3, and the other end of the current path of the n-type transistor N3 is connected to a ground power supply voltage VSS. The voltage step-down circuit 35-1 operates when the select signal (Active) has been delivered to the gate electrode of the n-type transistor N3.

The variable resistance module 42 produces a stepped-down input voltage as an output voltage in accordance with a voltage which is delivered to a control terminal of a p-type transistor HP0 from the comparison module 41.

In the case of this example, the variable resistance module 42 is composed of the p-type MOS transistor HP0. In accordance with a control voltage which is applied to the gate electrode of the p-type transistor HP0, the p-type transistor HP0 delivers the input voltage, which is input from the comparison module 41, as the output voltage via the current path thereof. As in this example, it is advantageous to use the p-type transistor HP0, that a voltage drop is smaller, compared to use an n-type transistor. As a result, the influence due to a variance of devices is small. The transistors constituting the voltage step-down circuit 35-1 may have arbitrary sizes. It is desirable, however, that the ratio in size between the p-type transistor P1, P2 and the n-type transistor N1, N2 be equal.

The detection module 43 receives the output voltage. The detection module 43 outputs a division voltage between the output voltage and the ground power supply voltage VSS to the comparison module 41.

The detection module 43 comprises a variable resistor element R0 and a resistor element R1. One end of the variable resistor element R0 is connected to the output terminal, and the other end of the variable resistor element R0 is connected to one end of the resistor element R1 and the voltage step-down circuit 35-1. The other end of the resistor element R1 is connected to the ground power supply voltage VSS.

As will be described later, by the above-described structure, when a high voltage is not used as a voltage which is supplied to the word line WL, as in the case of, e.g. the data read operation, the output voltage (corresponding to the input voltage in FIG. 4) from the boost circuit & output control circuit (32-0 to 32-31) is stepped down via the voltage step-down circuit 35-1. The stepped-down output voltage is delivered to the word line WL via the CG driver. To be more specific, at the time of, e.g. the data read operation, an operation is executed to set the voltage of the gate electrode of the n-type transistor N1 at the reference voltage VREF. In this case, the voltage that is applied to the gate electrode of the p-type transistor HP0 varies in accordance with the amount of current flowing in the current path of the n-type transistor N1 and p-type transistor P1. The input voltage is stepped down to the output voltage which is set in accordance with the voltage that is applied to the gate electrode of the p-type transistor HP0. As a result, the input voltage is output as an output voltage with a decreased ripple. In the meantime, the set output voltage is determined by the reference voltage VREF and the sizes of the variable resistor element R0 and resistor element R1 of the detection module 43.

1-5. Re: Relationship Between the Set Voltage and Boost Capability of the Boost Circuit Next, referring to FIG. 5, a description is given of the relationship between the set voltage and boost capability (Iout) of the boost circuit 39-1. In this case, the boost capability is substantially equivalent to the current that is output, and a ripple increases as the boost capability becomes higher.

Figure 5:
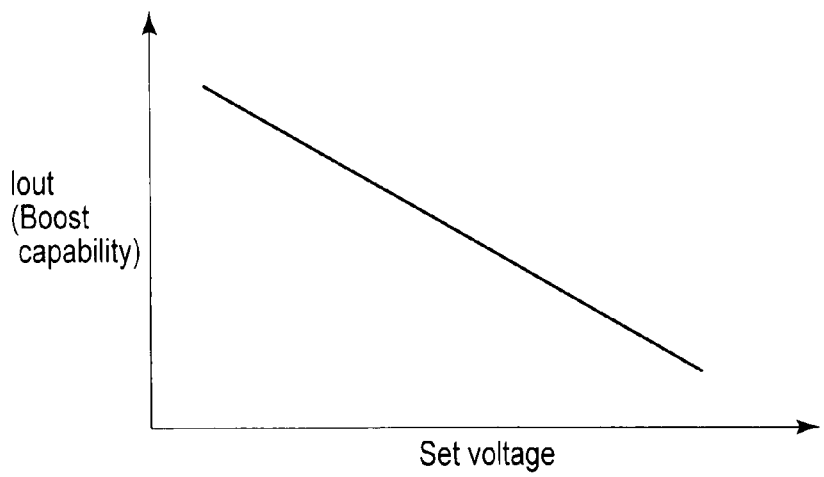
FIG. 5 is a graph showing a relationship between a set voltage and a boost capability of a boost circuit in FIG. 3.

As shown in FIG. 5, the set voltage and boost capability of the boost circuit 39-1 have an inversely proportional relationship. Specifically, in this relationship, the boost capability of the boost circuit 39-1 decreases, as the set voltage that is set by the boost output control circuit 38 becomes higher. Thus, it can be said that there is a trade-off relationship between the set voltage and boost capability of the boost circuit 39-1. It is understood, from FIG. 5, that the ripple increases when the set voltage is low. In other words, the influence of the ripple occurs when the set voltage is low.

2. Example of Control Operation (Switching Operation)

2-1. Case of Data Write Operation

Figure 6:
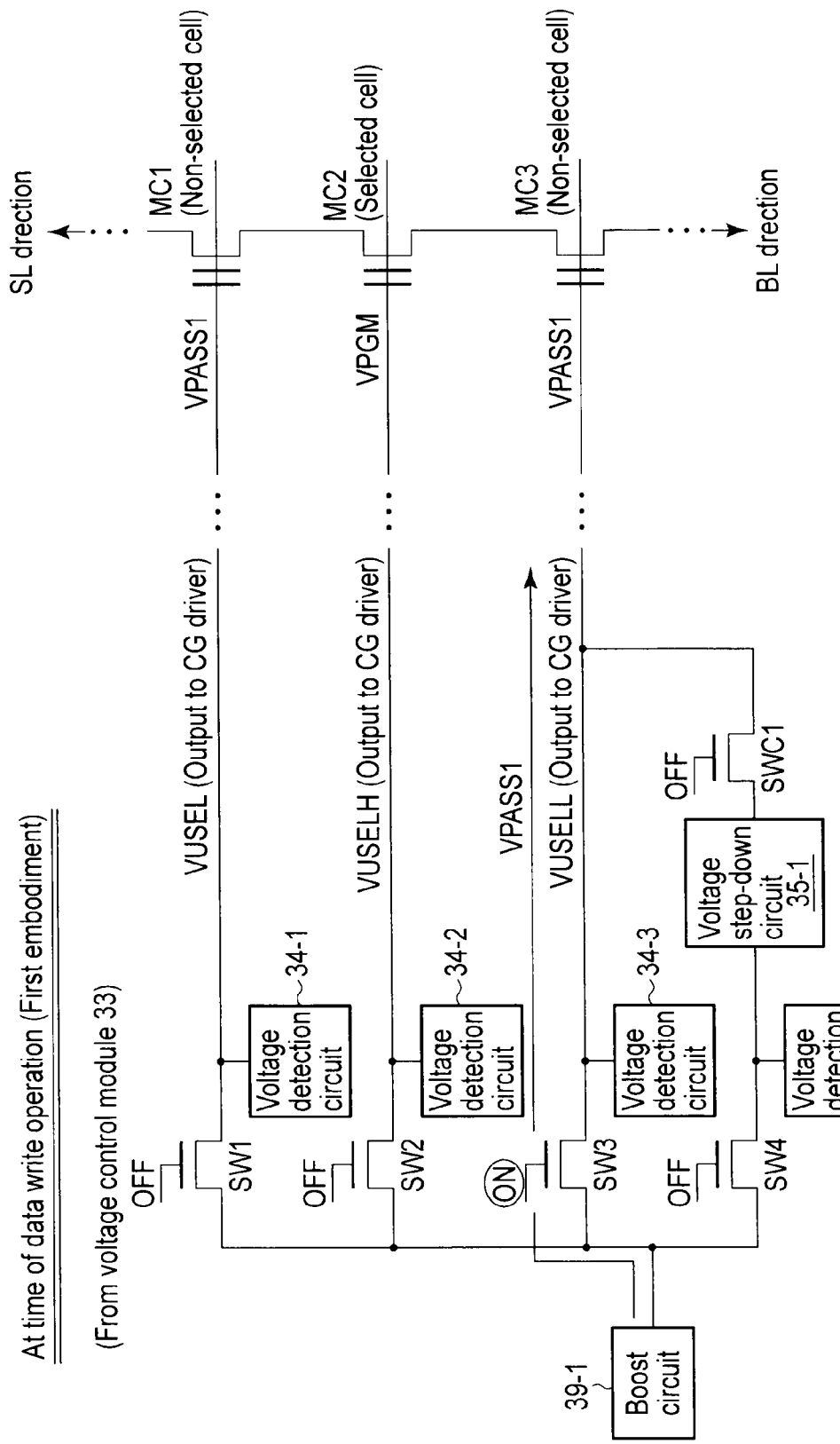
FIG. 6 is an equivalent circuit diagram showing a relationship in voltage at a time of a data write operation of the power supply circuit according to the first embodiment.

To begin with, referring to FIG. 6, a description is given of the control operation in the case of the data write operation of the power supply circuit according to the first embodiment.

The case of the data write operation is a case in which the influence of a ripple is not so serious, that is, the set voltage is high. In this case, such control is executed that a voltage, which has been boosted by the boost circuit 39, is directly transferred to the driver circuit 13, not through the voltage step-down circuit 35-1.

To be more specific, the relationship in voltage at the time of the data write operation is as shown in FIG. 6.

In the NAND flash memory of this example, data write is executed from the memory cell on the source line side (SL direction). Thus, by the control described below, a write voltage VPGM is applied to the control electrode CG (word line WL) of a selected memory cell MC2.

When a voltage is applied to the control electrode CG (word line WL) of a non-selected memory cell MC3 which neighbors the selected memory cell MC2, the switching elements SW1, SW2, SW4 and SWC1 are turned off (OFF), and the switching element SW3 is turned on (ON). Accordingly, the voltage, which has been boosted by the boost circuit 39-1, is not delivered to the voltage step-down circuit 35, and the voltage (VUSELL), which has been boosted by the boost circuit 39-1, is output to the CG driver CGD3.

The voltage (VUSELL), which has been boosted by the boost circuit 39-1, is delivered, as a write pass voltage VPASS1, to the control electrode CG (word line WL) of the non-selected memory cell MC3 neighboring the selected memory cell MC2, via the CG driver CGD3 and row decoder 12.

Also in the case of applying a voltage to the control electrode CG (word line WL) of a non-selected memory cell MC1 neighboring the selected memory cell MC2, the same operation as in the case of applying the voltage to the control electrode CG (word line WL) of the non-selected memory cell MC3 is executed.

2-2. Case of Data Read Operation

Figure 7:
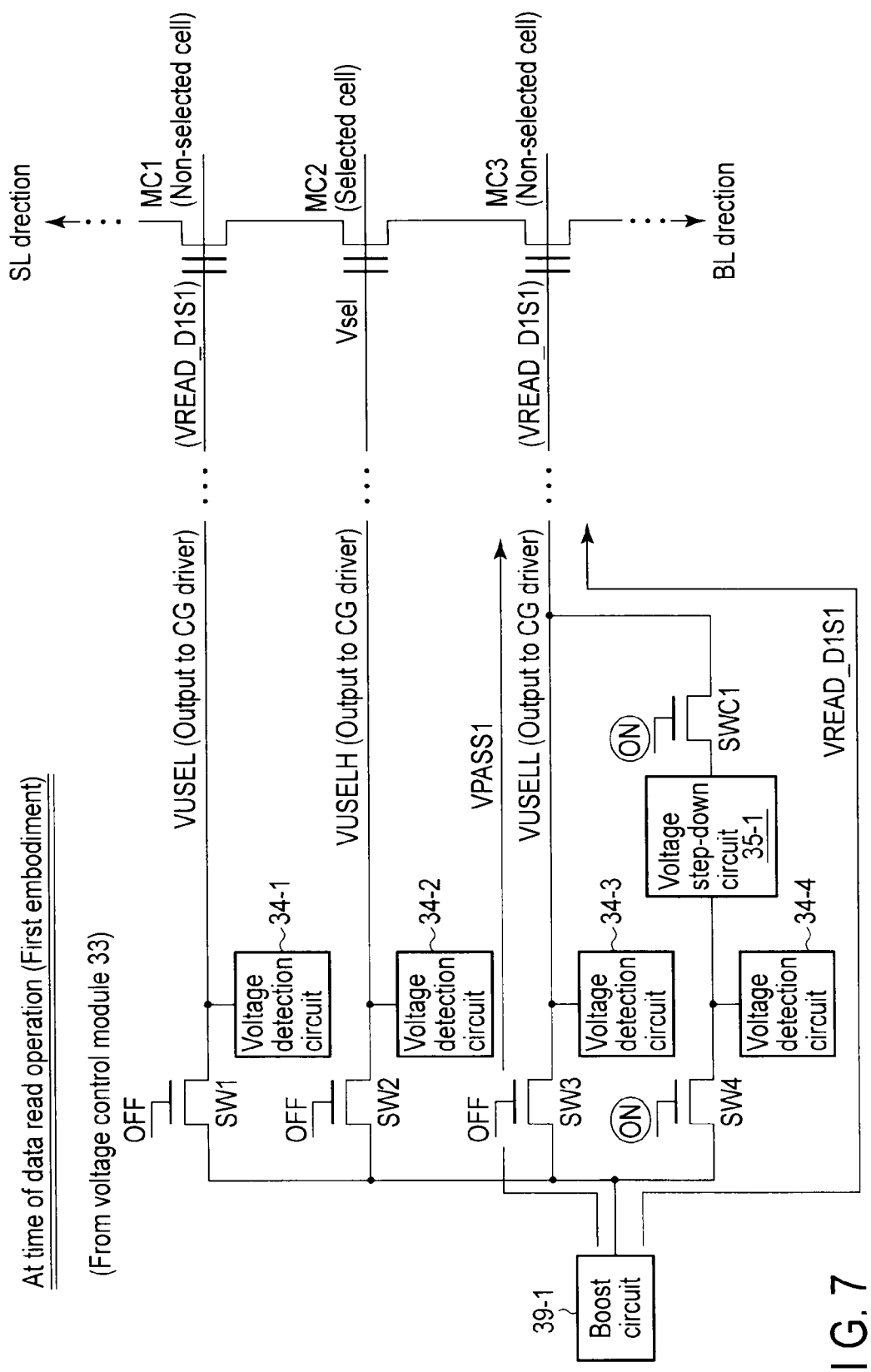
FIG. 7 is an equivalent circuit diagram showing a relationship in voltage at a time of a data read operation of the power supply circuit according to the first embodiment.

Next, referring to FIG. 7, a description is given of the control operation in the case of the data read operation of the power supply circuit according to the first embodiment. The case of the data read operation is a case in which the influence of a ripple is serious, that is, the voltage is not so high. In this case, a voltage, which has been boosted by the boost circuit 39, is stepped down via the voltage step-down circuit 35-1. As a result, the input voltage with a decreased ripple is transferred to the driver circuit 13.

To be more specific, the relationship in voltage at the time of the data read operation is as shown in FIG. 7.

By the same control as described below, a read voltage Vsel is applied to the selected word line of the selected memory cell MC2.

When a voltage is applied to the word line of the selected memory cell MC2, the switching elements SW1, SW2 and SW3 are turned off (OFF) and the switching elements SW4 and SWC1 are turned on (ON) by select signals from the voltage control module 33. Accordingly, the voltage, which has been boosted by the boost circuit 39-1, and the ripple of the voltage are decreased via the voltage step-down circuit 35, and the voltage (VUSELL) with the decreased ripple is output to the CG driver CGD2.

To be more specific, at the time of the data read operation, the voltage step-down circuit 35-1 operates so as to set the voltage of the gate electrode of the n-type transistor N1 at the reference voltage VREF. In this case, the voltage that is applied to the gate electrode of the p-type transistor HP0 varies in accordance with the amount of current flowing in the current path of the n-type transistor N1 and p-type transistor P1. The input voltage is stepped down to the output voltage which is set in accordance with the voltage that is applied to the gate electrode of the p-type transistor HP0. As a result, the input voltage is output as an output voltage (VUSELL) with a decreased ripple. In the meantime, the set output voltage (VUSELL) is determined by the reference voltage VREF and the sizes of the variable resistor element R0 and resistor element R1 of the detection module 43.

The voltage (VUSELL), which has been stepped down by the voltage step-down circuit 35-1, is delivered, as a read voltage Vsel, to the control electrode CG (word line WL) of the selected memory cell MC2 via the CG driver CGD2 and row decoder 12.

Similarly, when a voltage is applied to the control electrode CG (word line WL) of each of the non-selected memory cells MC3 and MC1 which neighbor the selected memory cell MC2, the switching elements SW1, SW2 and SW3 are turned off (OFF) and the switching elements SW4 and SWC1 are turned on (ON) by select signals from the voltage control module 33. Accordingly, the voltage, which has been boosted by the boost circuit 39-1, 39-3, and the ripple of the voltage are decreased via the voltage step-down circuit 35-1, and the voltage (VUSELL) with the decreased ripple is output to the CG driver CGD1, CGD3.

Although the data read operation has been described by way of example, this example is not limited to this case. For example, there is the same relationship in voltage in a read operation (verify operation) for checking the state of the memory cell. Thus, this example is similarly applicable, and the same advantageous effects can be obtained.

3. Advantageous Effects

As has been described above, according to the power supply circuit of the first embodiment, at least the following advantageous effect (1) can be obtained.

(1) The ripple can be decreased, and the reliability can advantageously be enhanced.

As has been described above, the power supply circuit 14 according to the first embodiment is the power supply circuit which generates the power supply voltage that is to be supplied to the memory cell array 11 including the plural memory cells MC which are disposed at the intersections between the plural word lines and bit lines. The power supply circuit 14 comprises at least the boost circuit (e.g. first boost circuit) 39-1, the voltage step-down circuit (first voltage step-down circuit) 35-1, and the voltage control module 33 which controls the first boost circuit 39-1 and first voltage step-down circuit 35-1. The voltage control module 33 executes the following control:

(I) At the time of transferring a first voltage (e.g. VPASS1) to the non-selected memory cell MC1, MC3, the voltage control circuit 33 generates a voltage, which is boosted by the first boost circuit 39-1, without the intervention of the first voltage step-down circuit 35-1 (FIG. 6), and (II) At the time of transferring a second voltage (e.g. Vsel), which is lower than the first voltage, to the selected memory cell MC2, the voltage control circuit 33 executes such switching control as to step down, via the first step-down circuit 35-1, the voltage which has been boosted by the first boost circuit 39-1 (FIG. 7).

By the above control, the influence of the ripple upon the selected word line can be decreased.

As has been described above, the power supply circuit 14 according to the first embodiment can execute such switching that the voltage, which has been boosted by the boost circuit 39-1, is directly output as the output voltage to the memory cell MC2, or the voltage, which has been boosted by the boost circuit 39-1, is stepped down and a voltage with little voltage variation, such as a ripple, is output as the output voltage.

Thus, in the case (I) in which a high voltage (first voltage (e.g. VPASS1)) is used, without occurring a voltage variation such as a ripple at the data write operation, the input voltage can directly be output to the driver circuit 13 from the boost circuit 39-1. On the other hand, in the case (II) in which a relatively low voltage (second voltage (e.g. Vsel)), whose voltage variation, such as a ripple, affects the operation, is used as in the case of the data read operation, the input voltage, which has been boosted by the boost circuit 39-1, is stepped down via the voltage step-down circuit 35-1 and the voltage with the decreased ripple can be transferred to the driver circuit 13.

As has been described above, according to the structure and control relating to the present embodiment, since the voltage variation can be reduced, the ripple can be decreased, and reliability can advantageously be enhanced.

Moreover, since the ripple is decreased in those of non-selected lines, which neighbor the selected line on both sides, it is possible to prevent the variation of the voltage of the control electrode CG (word line WL) of the selected memory cell. As a result, the spread of the distribution of the threshold voltage Vth can advantageously be prevented.

There is a tendency that the voltage (VREAD_D1S1), which is applied to the non-selected line at the time of the data read, is lower than the voltage (Vpass) which is applied to the non-selected line at the time of the data write. Thus, even if the voltage, which is applied to the non-selected word line at the time of data read, is stepped down via the voltage step-down circuit 35-1, a temporal load on the power supply circuit is not so large.

Besides, the output of the power supply circuit 14 can be varied based on used voltage.

Second Embodiment

An Example Relating to Two Voltage Step-Down Circuits

Figure 9:
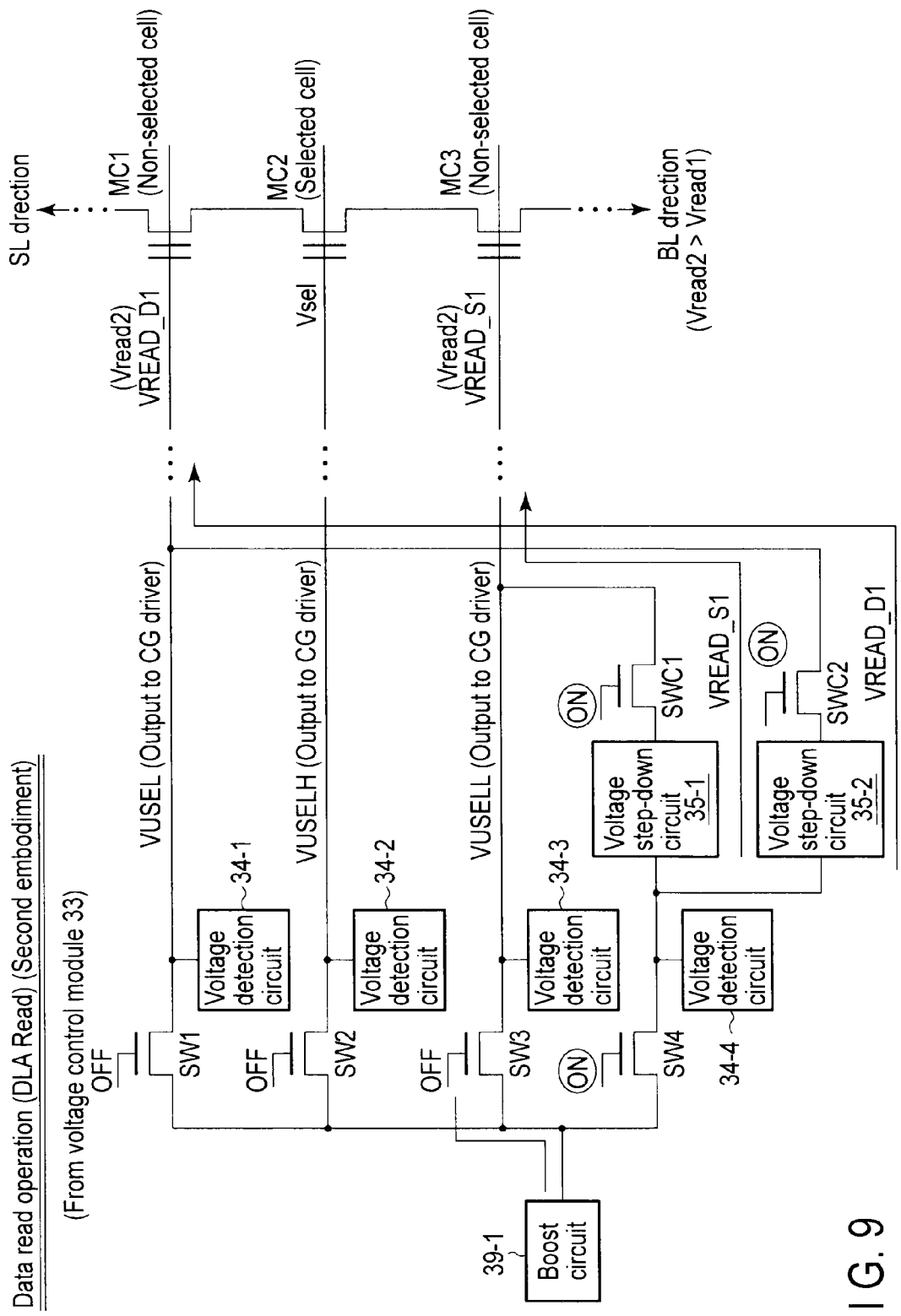
FIG. 9 is an equivalent circuit diagram showing a relationship in voltage at a time of a data read operation of the power supply circuit according to the second embodiment.
Figure 10:
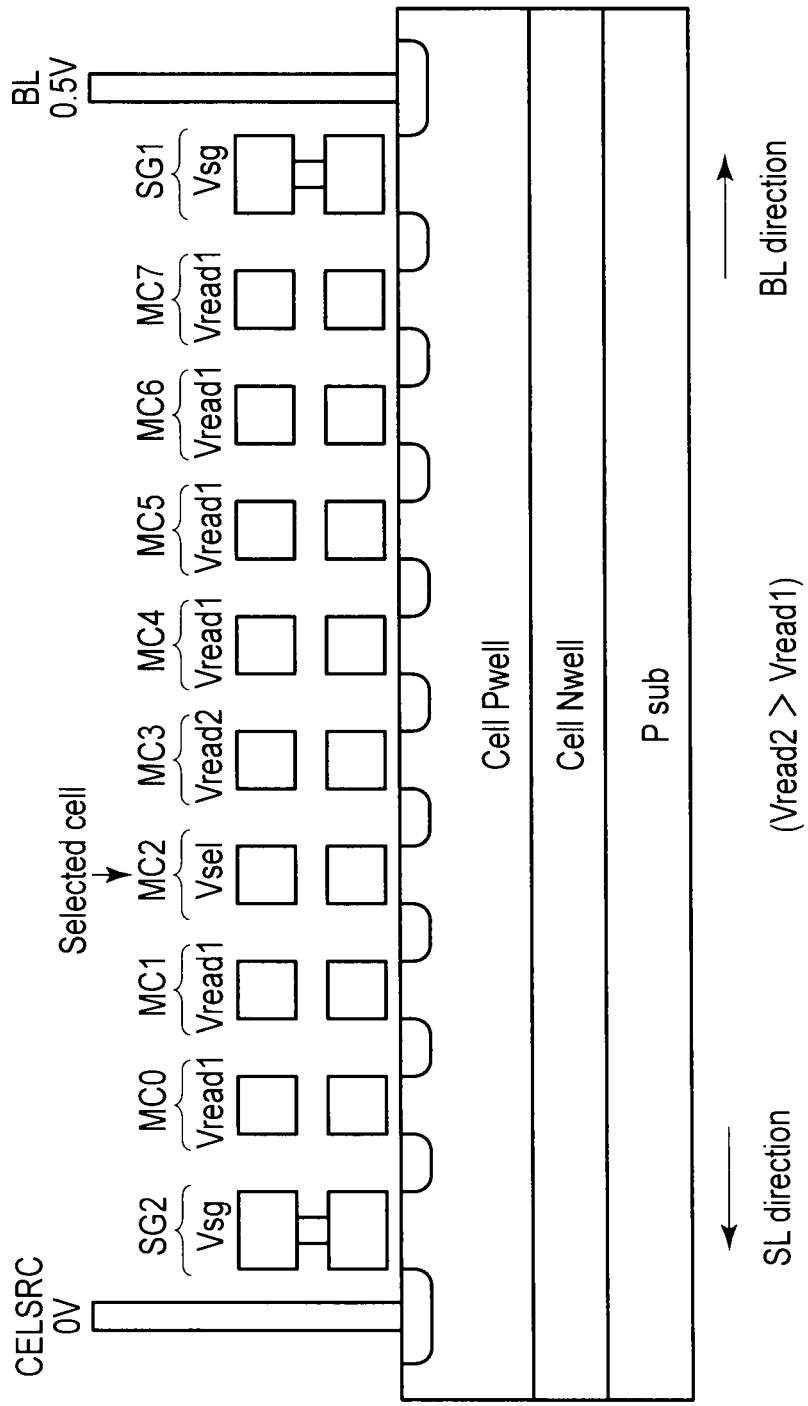
FIG. 10 is a cross-sectional view showing a relationship in voltage of a NAND string a time of the data read operation of the power supply circuit according to the second embodiment.

Next, referring to FIG. 8 to FIG. 10, a power supply circuit according to a second embodiment is described. This embodiment relates to an example of two voltage step-down circuits. A detailed description of the parts, which are common to the parts in the first embodiment, is omitted here.

Structure Example

Structure Example of Power Supply Circuit

To begin with, referring to FIG. 8, a structure example of a power supply circuit 14 according to the second embodiment is described.

As shown in FIG. 8, the power supply circuit 14 of this embodiment further includes a voltage step-down circuit (second voltage step-down circuit) 35-2 and a switching circuit SWC2. The second embodiment differs from the first embodiment in that the second embodiment relates to two voltage step-down circuits (first and second voltage step-down circuits) 35-1 and 35-2. The two voltage step-down circuits (first and second voltage step-down circuits) 35-1 and 35-2 have different voltage step-down rates.

An input of the voltage step-down circuit (second voltage step-down circuit) 35-2 is connected to an output of the detection circuit 34-4, and an output of the voltage step-down circuit 35-2 is connected to one end of the current path of the switching element SWC2. The structure of the voltage step-down circuit 35-2 is the same as that of the voltage step-down circuit 35-1. However, the resistance value of the variable resistor element R0 of the detection module 43 is different between the voltage step-down circuits 35-1 and 35-2. The resistance value of the variable resistor element R0 can be varied by the voltage control module 33.

The other end of the current path of the switching element SWC2 is connected to the CG driver CGD0 as a voltage VUSEL, and the gate electrode of the switching element SWC2 is controlled by the voltage control module (reference numeral 33 in FIG. 3) which is not shown in FIG. 8.

In the structure of this embodiment, as described above, the boost circuit 39-1, switching element SW4 and voltage detection circuit 34-4 are shared by the two voltage step-down circuits 35-1 and 35-2. A voltage control circuit 31-2 can output different output voltages to the driver circuit 13 by the two voltage step-down circuits 35-1 and 35-2. In this manner, by the sharing of the switching element SW4 and voltage detection circuit 34-4, the structural circuits can be reduced, and the simplification of the circuit and the reduction in occupied area can advantageously be achieved.

The control of this circuit structure can similarly be executed by the voltage control module (33).

Example of Control Operation (Switching Control)

The Case of Data Read (DLA Read) Operation

Next, referring to FIG. 9, a description is given of the control operation in the case of the data read operation of the power supply circuit according to the second embodiment. This data read operation is the same as the above-described data read operation in that the problem of the ripple is serious and the necessary voltage is not so high.

The second embodiment differs from the first embodiment in that the voltage, which is boosted by the boost circuit (e.g. boost circuit 39-1) is stepped down by the plural voltage step-down circuits 35-1 and 35-2, and the output voltages with reduced ripples can be transferred via the driver circuits 13 to the non-selected memory cells (MC1, MC3) which neighbor the selected memory cell MC2 on both sides. In the present embodiment, DLA read (DLA Read) of the NAND flash memory is described by way of example.

At the time of data read, a read voltage Vsel is applied to the control electrode CG (word line WL) of the selected memory cell MC2. In addition, at the time of data read, different read pass voltages (Vread1, Vread2) are applied to the control electrodes CG (word lines WL) of the non-selected memory cells (MC1, MC3) which neighbor the selected memory cell MC2.

To be more specific, the relationship in voltage at the time of the data read operation is as shown in FIG. 9.

As shown in FIG. 9, when a voltage is applied to the word lines of the non-selected memory cells MC1 and MC3 which neighbor the selected memory cell MC2, the switching elements SW1, SW2 and SW3 are turned off (OFF) and the switching elements SW4, SWC1 and SWC2 are turned on (ON) by control signals from the voltage control module 33. Accordingly, the voltage, which has been boosted by the boost circuit 39-1, 39-3, and the ripple of the voltage are decreased via the voltage step-down circuit 35-1, 35-2, and the voltage (VUSEL, VUSELL) with the decreased ripple is output to the CG driver CGD1, CGD3.

To be more specific, the voltage step-down circuit 35-1, 35-2 operates so as to set the voltage of the gate electrode of the n-type transistor N1 at the reference voltage VREF. In this case, the voltage that is applied to the gate electrode of the p-type transistor HP0 varies in accordance with the amount of current flowing in the current path of the n-type transistor N1 and p-type transistor P1. The input voltage is stepped down to the output voltage which is set in accordance with the voltage that is applied to the gate electrode of the p-type transistor HP0. As a result, the input voltage is output as an output voltage (VUSEL, VUSELL) with a decreased ripple. In the meantime, the set output voltage (VUSEL, VUSELL) is determined by the reference voltage VREF and the sizes of the variable resistor element R0 and resistor element R1 of the detection module.

The voltages (VUSEL, VUSELL), which have been stepped down by the voltage step-down circuits 35-1 and 35-2, are applied, as read pass voltages VREAD_D1 (Vread1) and VREAD_S1 (Vread2), to the word lines of the non-selected memory cells MC1 and MC3 which neighbor the selected memory cell MC2, via the CG drivers CGD1 and CGD3 and row decoder 12.

The relationship in voltage of the entire NAND string at this time is as shown in FIG. 10.

As shown in FIG. 10, there is a case where the read pass voltage VREAD_S1 (Vread2), which is applied to the non-selected memory cell MC3 (memory cell on the bit line side (BL direction)) in which data write is executed after the selected memory cell MC2, is controlled to become higher than the read pass voltages VREAD_D1 (Vread1) which is applied to the other non-selected memory cell MC1 (Vread2>Vread1).

Since the data write in the non-selected memory cell MC3 (memory cell on the bit line side (BL direction)), which neighbors the selected memory cell MC2 on the bit line side, is executed after the data write in the selected memory cell MC2, the threshold voltage of the non-selected memory cell MC3 is increased by the capacitive coupling between the neighboring memory cells. Thus, there is a case where the read pass voltage Vread2 of the non-selected memory cell MC3 is controlled to become higher than the read pass voltage Vread1 (Vread2>Vread1) which is applied to the other non-selected memory cells (MC0, MC1, MC4 to MC7), by such a degree as to cancel the apparent increase of the threshold voltage.

As has been described above, according to this example, even when the threshold rises due to the capacitive coupling between the memory cells, the voltage, which has been boosted by the boost circuit 39-1, and the ripple of the voltage due to the voltage variation can be decreased via the voltage step-down circuit 35-1, 35-2. As a result, the precision of the output voltage to the driver circuit 13 can be improved, and the output voltage can be applied as the read pass voltage Vread1, Vread2 (Vread2>Vread1) to the non-selected memory cell MC1, MC3. In particular, it is preferable that the read pass voltage Vread2 be exactly controlled. The reason is that the increase of the threshold due to the capacitive coupling between the memory cells is canceled. Specifically, by using the output voltage with the decreased ripple, the increase of the threshold due to the capacitive coupling between the memory cells can exactly be canceled.

Substantially the same as described above applies to the data write operation, etc.

Advantageous Effects

As has been described above, according to the power supply circuit of the second embodiment, at least the same advantageous effect (1) as described above can be obtained. Moreover, according to the second embodiment, at least the following advantageous effects (2) and (3) can be obtained.

(2) Even when a variation of the threshold occurs due to the capacitive coupling between the memory cells, the voltage variation can be decreased, and the precision of the voltage, which is applied to the non-selected memory cell, can be improved.

As has been described above, the power supply circuit 14 according to the second embodiment differs from that of the first embodiment in that the voltage step-down (second voltage step-down circuit) 35-2 and the switching element SWC2 are further included.

Thus, the second embodiment differs from the first embodiment in that at the time of the data read operation, the voltage, which has been boosted by the boost circuit (e.g. boost circuit 39-1), is stepped down via the plural voltage step-down circuits 35-1 and 35-2, and the voltage with the reduced ripple can be transferred to the non-selected memory cells (MC1, MC3) which neighbor the selected memory cell MC2 on both sides.

The voltages (VUSEL, VUSELL), which have been stepped down by the voltage step-down circuits 35-1 and 35-2, are applied, as read pass voltages VREAD_D1 (Vread1) and VREAD_S1 (Vread2), to the control electrodes (word lines) of the non-selected memory cells MC1 and MC3 which neighbor the selected memory cell MC2, via the CG drivers CGD1 and CGD3 and row decoder 12.

The relationship in voltage of the entire NAND string at this time is as shown in FIG. 10.

As shown in FIG. 10, the second embodiment differs from the first embodiment in that the read pass voltage VREAD_S1 (Vread2), which is applied to the non-selected memory cell MC3 (memory cell on the bit line side (BL direction)) which is read later, is controlled to become higher than the read pass voltages VREAD_D1 (Vread1) which is applied to the other non-selected memory cell MC1 (Vread2>Vread1).

In the non-selected memory cell MC3 (memory cell on the bit line side (BL direction)) which is read later, the apparent threshold voltage increases due to the capacitive coupling between the neighboring memory cells. Thus, the read pass voltage Vread2 of the non-selected memory cell MC3 is controlled to become higher than the read pass voltage Vread1 (Vread2>Vread1) which is applied to the other non-selected memory cells (MC0, MC1, MC4 to MC7), by such a degree as to cancel the apparent increase of the threshold voltage.

In this manner, in the present embodiment, even in the case where a variation of the threshold occurs due to the capacitive coupling between the memory cells, the voltage, which has been boosted by the boost circuit 39-1, is stepped down via the voltage step-down circuits 35-1 and 35-2, and the voltage with the reduced ripple and the enhanced precision can advantageously be applied, as read pass voltages Vread1 and Vread2 (Vread2>Vread1), to the non-selected memory cells MC1 and MC3.

Therefore, the reliability can effectively be improved.

(3) Microfabrication can advantageously be achieved.

In the case of the NAND flash memory as in the present embodiment, the influence of the variation of the threshold due to the capacitive coupling between the memory cells becomes large in the generation in which microfabrication with a design rule of, e.g. 60 nm or less is advanced. In the generation of the advanced microfabrication, since the difference in voltage between neighboring threshold voltage distributions is smaller, the influence of the apparent increase of the threshold voltage of the non-selected memory cell (MC3), which is read later, increases.

According to the present embodiment, even in the case of the semiconductor memory device of the advanced generation, in which the influence of the variation of the threshold due to the capacitive coupling between the memory cells becomes large, the precision can be improved to such a degree as to cancel the influence and the data read operation can be executed.

Therefore, the microfabrication can advantageously be achieved.

Third Embodiment

An Example Relating to a Plurality of Boost Circuits

Figure 11:
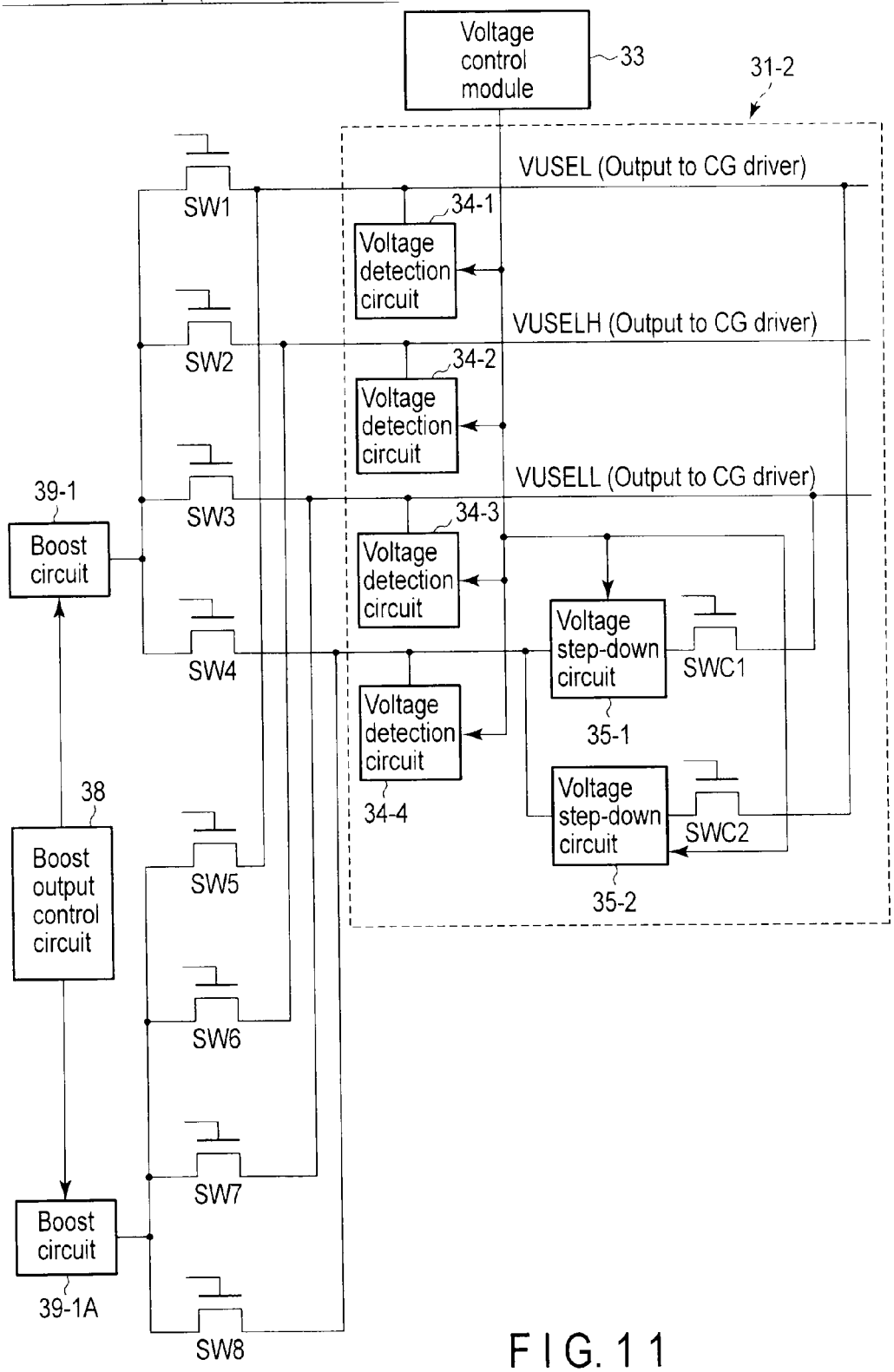
FIG. 11 is an equivalent circuit diagram showing a structure example of a power supply circuit according a third embodiment.

Next, referring to FIG. 11, a power supply circuit according to a third embodiment is described. This embodiment is an example relating to a plurality of boost circuits. A detailed description of the parts, which are common to the parts in the second embodiment, is omitted here.

Structure Example

Structure Example of Power Supply Circuit

FIG. 11 shows a structure example of the power supply circuit according to the third embodiment.

As shown in FIG. 11, the power supply circuit 14 of the third embodiment differs from that of the second embodiment in that the power supply circuit 14 of the third embodiment further includes a boost circuit (second boost circuit) 39-1A and switching elements SW5 to SW8, and the third embodiment relates to two boost circuits (first and second boost circuits) 39-1 and 39-1A.

The boost circuit (second boost circuit) 39-1A boosts an input voltage to a predetermined value (e.g. a voltage higher than the internal power supply voltage). The output of the boost circuit 39-1A is connected to one end of the current path of each of the switching elements SW5 to SW8.

The other ends of the current paths of the switching elements SW5 to SW8 are commonly connected, together with the other ends (output terminals) of the current paths of the switching elements SW1 to SW4, to the input terminal of the voltage control circuit 31-2. Meanwhile, the gate electrodes of the switching elements SW5 to SW8 are controlled by the voltage control module (reference numeral 33 in FIG. 3) which is not shown.

In the structure of this example, as described above, the voltage detection circuits 34-1 to 34-4, voltage step-down circuits 35-1 and 35-2 and switching elements SWC1 and SWC2 are shared by the two boost circuits 39-1 and 39-1A. The outputs by the two boost circuits 39-1 and 39-1A can be controlled from the shared circuits. In this manner, by sharing the circuits, the structural circuits can be reduced, and the simplification of the circuit and the reduction in occupied area can advantageously be achieved.

The control of this circuit structure can similarly be executed by the voltage control module (reference numeral 33 in FIG. 3).

Example of Control Operation (Switching Control)

The control operation of the data read operation, etc. of the power supply circuit according to the third embodiment is substantially the same as the control operation in the second embodiment.

The third embodiment differs from the second embodiment in that according to the power supply circuit of the third embodiment, the number of boost circuits 39-1 and 39-1A, which are to be selected, is varied, and the boost capability can be adjusted where necessary.

For example, at the beginning of the data write operation or data read operation, the voltage control module 33 turns on (ON) the switching elements SW1 to SW8 and executes the boost operation by the two boost circuits 39-1 and 39-1A up to a predetermined voltage (non-write voltage VPASS, non-read voltage VREAD). By this operation, the voltage can be quickly boosted.

On the other hand, after reaching the predetermined voltage (non-write voltage VPASS, non-read voltage VREAD) in the data write operation or data read operation, the boost output control circuit 38 stops the operation of the boost circuit 39-1A, the voltage control module 33 turns off (OFF) the switching elements SW1 to SW4, and the boost operation is executed by the single boost circuit 39-1. By this operation, the electric current consumed by the operation of the boost circuit can be reduced.

In the present embodiment, the example of two boost circuits has been illustrated. However, the number of boost circuits is not limited to this example. Where necessary, a plurality of boost circuits may be disposed.

Advantageous Effects

As has been described above, according to the power supply circuit of the third embodiment, at least the same advantageous effects (1), (2) and (3) as described above can be obtained. Moreover, according to the third embodiment, at least the following advantageous effects (4) and (5) can be obtained.

(4) The structural circuits can be reduced, and the simplification of the circuit and the reduction in occupied area can advantageously be achieved.

The power supply circuit 14 of the third embodiment differs from that of the second embodiment in that the power supply circuit 14 of the third embodiment further includes the boost circuit (second boost circuit) 39-1A and switching elements SW5 to SW8, and the third embodiment relates to two boost circuits (first and second boost circuits) 39-1 and 39-1A.

In the structure of this example, as described above, the voltage detection circuits 34-1 to 34-4, voltage step-down circuits 35-1 and 35-2 and switching elements SWC1 and SWC2 are shared by the two boost circuits 39-1 and 39-1A. The outputs by the two boost circuits 39-1 and 39-1A can be controlled from the shared circuits by boost output control circuit 38. In this manner, by sharing the circuits, the structural circuits can be reduced, and the simplification of the circuit and the reduction in occupied area can advantageously be achieved.

(5) The number of boost circuits 39-1 and 39-1A, which are to be selected, is varied, and the boost capability can be adjusted where necessary.

For example, at the beginning of the data write operation or data read operation, the voltage control module 33 turns on (ON) the switching elements SW1 to SW8 and executes the boost operation by the two boost circuits 39-1 and 39-1A up to a predetermined voltage (non-write voltage VPASS, non-read voltage VREAD). By this operation, the voltage can be quickly boosted.

On the other hand, after reaching the predetermined voltage (write voltage VPGM, read voltage Vset) in the data write operation or data read operation, the boost output control circuit 38 stops the operation of the boost circuit 39-1A, the voltage control module 33 turns off (OFF) the switching elements SW5 to SW8, and the boost operation is executed by the single boost circuit 39-1. By this operation, the electric current consumed by the operation of the boost circuit can be reduced.

In this manner, the boost capability can advantageously be adjusted by varying the number of boost circuits 39-1 and 39-1A which are selected and operated.

As regards the relationship in voltage as shown in the first to third embodiments, in many cases, the voltage (first voltage: VPGM, VPASS), which is transferred to the memory cell array at the time of the data write operation, is higher than the voltage (second voltage: Vsel, VREAD_D1S1, Vread1, Vread2), which is transferred to the memory cell array at the time of the data read operation.

The above-described embodiments relate to the case in which at the time of the read operation, the voltage is transferred via the voltage step-down circuit 35 to the control electrodes CG (word lines WL) of the non-selected memory cells which neighbor the selected memory cell on both sides. Alternatively, the voltage may be transferred via the voltage step-down circuit 35 to only the control electrode CG (word line WL) of the non-selected memory cell which neighbors the selected memory cell on one side. In addition, at the time of the read operation, the voltage may be transferred, not via the voltage step-down circuit 35, to the control electrodes CG (word lines WL) of the non-selected memory cells which neighbor the selected memory cell on both sides. As a result, the boost output control circuit 38 does not need to operate the boost circuit by taking into account the stepped-down voltage component due to the voltage step-down circuit 35. In short, the power consumption by the semiconductor device can be reduced.

Besides, the voltage VPASS is transferred, not via the voltage step-down circuit 35, to the control electrode CG (word line WL) of the non-selected memory cell, but the voltage VPASS may be transferred via the voltage step-down circuit 35. In addition, the voltage may be transferred via the voltage step-down circuit 35 to the control electrodes CG (word lines WL) of non-selected memory cells which do not neighbor the selected memory cell on both sides.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power supply circuit which outputs a voltage to a memory cell array including a plurality of memory cells, comprising:
a first boost circuit configured to boost an input voltage;
a first voltage step-down circuit including an input connected to an output of the first boost circuit; and
a voltage control circuit configured to control the first boost circuit and the first voltage step-down circuit,
wherein the voltage control circuit is configured to output, not via the first voltage step-down circuit, a voltage which is boosted by the first boost circuit, when a first voltage is transferred to a non-selected memory cell, and
the voltage control circuit is configured to step down, via the first voltage step-down circuit, the voltage which is boosted by the first boost circuit, when a second voltage is transferred to a non-selected memory cell which neighbors a selected memory cell, the second voltage being lower than the first voltage.

2. The circuit of claim 1, further comprising a second voltage step-down circuit including an input connected to the output of the first boost circuit.

3. The circuit of claim 2, wherein when the second voltage is transferred, the voltage control circuit is configured to execute control to apply a first pass voltage via the first voltage step-down circuit to a first non-selected memory cell which neighbors a selected memory cell in a direction of the word lines and is selected later, and to apply a second pass voltage via the second voltage step-down circuit to an other non-selected memory cells other than the first non-selected memory cell, the second pass voltage being lower than the first pass voltage.

4. The circuit of claim 1, further comprising a second boost circuit including an output electrically connected to the output of the first boost circuit.

5. The circuit of claim 4, wherein the voltage control circuit is configured to execute a boost operation by the first and second boost circuits until reaching a predetermined voltage in an operation of transferring the first and second voltages, and
the voltage control circuit is configured to execute a boost operation by one of the first and second boost circuits after the predetermined voltage is reached in the operation of transferring the first and second voltages.

6. The circuit of claim 1, wherein the first voltage step-down circuit comprises:
a comparison module;
a variable resistance module disposed in a current path between an input end and an output end and including a p-type transistor including a resistance varied by a voltage which is applied to a control terminal by the comparison module; and
a detection module configured to detect an output voltage which is applied to the output end.

7. The circuit of claim 1, wherein an operation at a time when the first voltage is transferred to the memory cell array is a data write operation of the memory cells, and
an operation at a time when the second voltage is transferred to the memory cell array is a data read operation or a verify operation of the memory cells.

8. A semiconductor memory device comprising:
a power supply circuit includes:
a first boost circuit configured to boost an input voltage;
a first voltage step-down circuit including an input connected to an output of the first boost circuit; and
a voltage control circuit configured to control the first boost circuit and the first voltage step-down circuit, wherein the voltage control circuit is configured to output, not via the first voltage step-down circuit, a first voltage, and the voltage control circuit is configured to output, via the first voltage step-down circuit, a second voltage which is stepped down by the first boost circuit, the second voltage being lower than the first voltage.

9. The device of claim 8, further comprising,
a memory cell array including a plurality of memory cells,
wherein the first voltage is applied to selected word line of the plurality of word lines, and the second voltage is applied to non-selected word line of the plurality of word lines.

10. The device of claim 8, wherein the power supply circuit further includes a second voltage step-down circuit including an input connected to the output of the first boost circuit.

11. The device of claim 10, further comprising,
a memory cell array including a plurality of memory cells,
wherein when the second voltage is transferred, the voltage control circuit is configured to execute control to apply a first pass voltage via the first voltage step-down circuit to a first non-selected word line of the plurality of word lines which neighbors a selected word line of the plurality of word lines in a direction of the word lines and is selected later, and to apply a second pass voltage via the second voltage step-down circuit to an other non-selected memory cells other than the first non-selected memory cell, the second pass voltage being lower than the first pass voltage.

12. The device of claim 8, wherein the power supply circuit further includes a second boost circuit including an output electrically connected to the output of the first boost circuit.

13. The device of claim 12, wherein the voltage control circuit is configured to execute a boost operation by the first and second boost circuits until reaching a predetermined voltage in an operation of transferring the first and second voltages, and
the voltage control circuit is configured to execute a boost operation by one of the first and second boost circuits after the predetermined voltage is reached in the operation of transferring the first and second voltages.

14. The device of claim 8, wherein the first voltage step-down circuit comprises:
a comparison module;
a variable resistance module disposed in a current path between an input end and an output end and including a p-type transistor including a resistance varied by a voltage which is applied to a control terminal by the comparison module; and
a detection module configured to detect an output voltage which is applied to the output end.

15. The device of claim 9, wherein an operation at a time when the first voltage is transferred to the memory cell array is a data write operation of the memory cells, and
an operation at a time when the second voltage is transferred to the memory cell array is a data read operation or a verify operation of the memory cells.

* * * * *